United States Patent
Mehta

(10) Patent No.: US 8,336,009 B2
(45) Date of Patent: Dec. 18, 2012

(54) METHOD AND APPARATUS FOR ELECTRONIC SYSTEM FUNCTION VERIFICATION AT TWO LEVELS

(75) Inventor: Ashok Mehta, Los Gatos, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 352 days.

(21) Appl. No.: 12/827,012

(22) Filed: Jun. 30, 2010

(65) Prior Publication Data

US 2012/0005640 A1  Jan. 5, 2012

(51) Int. Cl.
*G06F 17/50* (2006.01)
(52) U.S. Cl. .................. 716/106; 716/103; 716/138
(58) Field of Classification Search .................. None
See application file for complete search history.

(56) References Cited

U.S. PATENT DOCUMENTS

| | | | |
|---|---|---|---|
| 5,953,519 A * | 9/1999 | Fura | 716/104 |
| 6,845,341 B2 * | 1/2005 | Beverly et al. | 702/182 |
| 7,472,361 B2 | 12/2008 | Watanabe et al. | |
| 7,607,116 B2 * | 10/2009 | Kwon | 716/106 |
| 8,020,124 B2 * | 9/2011 | Alexanian et al. | 716/106 |
| 8,122,398 B2 * | 2/2012 | Veller et al. | 716/103 |
| 2004/0054500 A1 | 3/2004 | Beverly et al. | |
| 2007/0277144 A1 | 11/2007 | Veller et al. | |
| 2009/0150136 A1 * | 6/2009 | Yang | 703/13 |
| 2011/0307847 A1 * | 12/2011 | Liao et al. | 716/103 |

OTHER PUBLICATIONS

OSCI TLM-2.0 Language Reference Manual, Software Version: TLM 2.0.1, Document Version JA32, Jul. 2009; http://www.systemc.org/downloads/standards/.

* cited by examiner

*Primary Examiner* — Leigh Garbowski
(74) *Attorney, Agent, or Firm* — Duane Morris LLP

(57) ABSTRACT

A method for verifying functionality of a system-on-chip (SoC) comprises modeling a system block in first and second models at a first level and a second level lower than the first level, respectively. A stimulus transaction is generated at a first testbench at the first level. The stimulus transaction is transmitted from the first testbench to a second testbench at the second level. The stimulus transaction is transformed into a first response transaction, using the first model, at the first level. The stimulus transaction received at the second testbench is transformed into a second response transaction, using the second model, at the second level. The first and second response transactions are stored in first and second response queues, respectively. Functionality of the SoC at the first and second levels is verified based on a comparison at the first testbench between head entries of the first and second response queues.

20 Claims, 11 Drawing Sheets

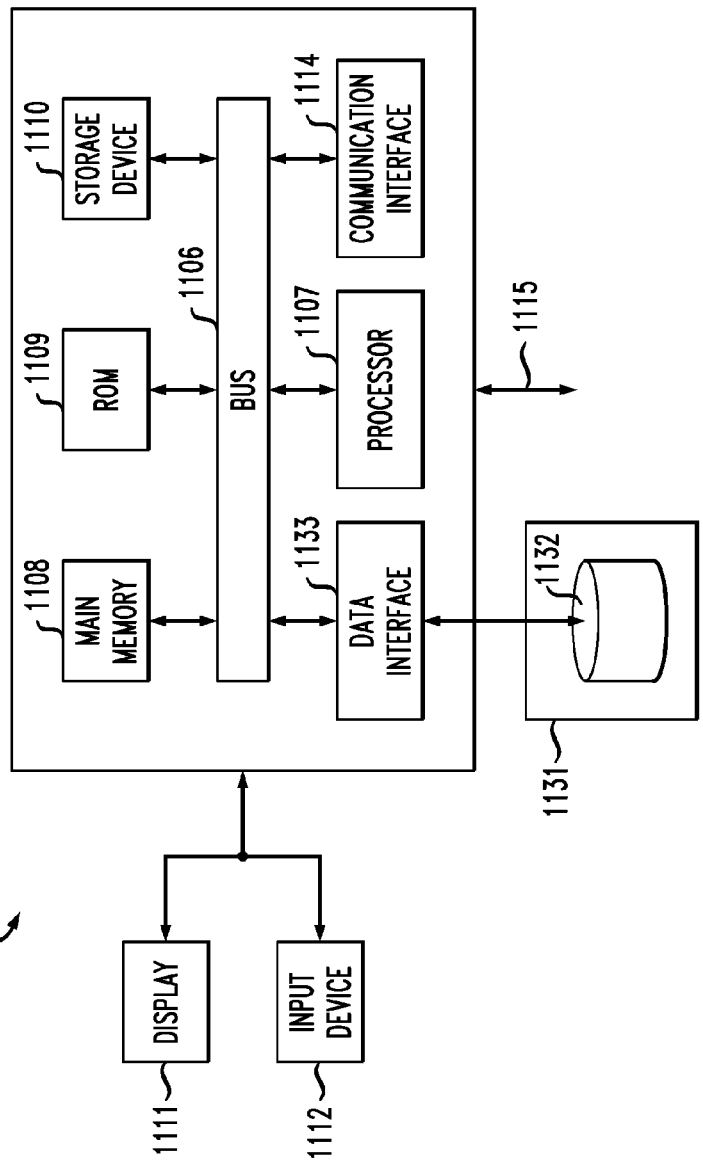

METHOD AND APPARATUS FOR ELECTRONIC SYSTEM FUNCTION VERIFICATION AT TWO LEVELS

BACKGROUND

Integrated circuit (IC) technology is continuously increasing in complexity due to improvements in semiconductor process fabrication techniques. Complete system-on-chip (SoC) solutions, involving many elements such as a processor, timer, interrupt controller, bus, memory, and/or embedded software on a single circuit, are now available for a variety of applications. A challenge facing SoC designers is the efficient verification of the functionality of such systems. At process fabrication technologies of 65 nm and smaller, with millions of transistors available to implement large and complex SoCs, the challenge of functionally verifying such complex devices grows exponentially. Industry data suggests that over half of all project resources are now typically allocated to the functional verification of these devices, yet over 60% of these devices require re-engineering due to functional bugs at the initial silicon stage.

A typical design process begins with a software program that describes the behavior or functionality of a circuit to be created. Such a software program is typically written in procedural languages such as C/C++ that defines behavior to be performed with limited implementation details. RTL (Register Transfer Level) is a level at which a digital system is described in terms of synchronous transfer between functional units. RTL is one level higher than a gate level. At RTL, every operation's order of execution (and thus timing) is completely specified. An RTL model of an IC device may be used as an input to an automated digital synthesis tool to create a gate level netlist. As used herein, the term "model" is used to describe a unit, which may be realized in software and embodied on a computer readable storage medium that represents the behavior of a desired device in a form other than the actual device. A gate level netlist further goes through transistor level transformations by so-called place and route tools to reach the physical IC level.

In order to test and explore changes in the design of a SoC, simulation must be performed, which is very time consuming. A few seconds of real-time simulation at a low level such as RTL can take days or longer. If the simulation results are not desirable, then the design process must start over again by changing high-level code and re-simulating.

Because of such delays in simulation, electronic system designers are beginning to move the design process to a higher level at which there is less focus on design details. At a higher level, design exploration can be performed to evaluate achievable performance and power consumption, which parts to use, etc. A higher level that has gained popularity is called Transaction Level Modeling (TLM) or "transaction level" (TL) as used herein, which refers to a high level for modeling digital systems where communication between modules is separated from the details of the implementation of functional units. The term "transaction" refers to an electronic representation that encodes a complete interaction, e.g., writing one or more bytes from CPU to memory. A transaction may be a sequence of instructions at a higher level than the basic, atomic level at which a device operates. A transaction at RTL typically requires multiple clock cycles to execute. A TL model can quickly calculate the end result of a transaction (e.g., the end state of a device being modeled) without the need to perform each step that the real device would actually perform. A transaction at TL level may take zero time or take some "approximated" time not measured in clock cycles. In contrast, RTL level transactions are considered to take up clock cycles. Thus, a TL model executes more quickly than a lower level (and thus more faithful) model, such as an RTL model. Although TL and RTL models are described herein, other higher level and lower level models are applicable as well, with the general truism that low level models produce results slower than high level models.

A testbench may be used in the verification of system blocks (e.g., components of a circuit, or an entire SoC) using transaction models. A testbench is a software application that applies a set of stimuli (e.g., one or more test vectors) to a model to produce a set of information (responses) used in analyzing the functionality or performance (e.g., timing) of a system block. Developing testbenches at the RTL level is time consuming due to the cycle accurate nature of RTL (e.g., specifying timing faithfully in terms of cycles). RTL testbench development is also error prone due to signal level accuracy considerations. Creating a testbench at the transaction level (TL) speeds up development time, simulation time, and debug time. However, one has to recode and redevelop the TL stimulus generation and response checking mechanisms and algorithms for RTL verification, negating any speedup obtained by operating at TL.

SUMMARY

A method for verifying functionality of a system-on-chip (SoC) is disclosed. A system block is modeled in first and second models at a first level and at a second level lower than the first level, respectively. A stimulus transaction is generated at a first testbench at the first level. The stimulus transaction is transmitted from the first testbench to a second testbench at the second level. The stimulus transaction is transformed into a first response transaction, using the first model, at the first level. The stimulus transaction received at the second testbench is transformed into a second response transaction, using the second model, at the second level. The first and second response transactions are stored in first and second response queues, respectively. Functionality of the SoC at the first and second levels is verified based on a comparison at the first testbench between head entries of the first and second response queues.

A computer-implemented integrated circuit verification system comprises first and second models at first and second levels, respectively, with the second level being lower than the first level. The system also has first and second testbenches. The first testbench is configured to provide a first stimulus transaction to the first model. The first testbench includes a stimulus generator configured to generate the first stimulus transaction, first and second response queues, and a verification module configured to verify functionality of a system-on-chip (SoC) based on a comparison between head entries of the first and second response queues. The second testbench is configured to receive the first stimulus transaction from the first testbench and provide the first stimulus transaction to the second model. The first and second response queues are configured to store response transactions produced by the first and second models, respectively.

A computer readable storage medium has instructions stored on it. The instructions, when executed by a processor, cause the processor to perform the operations described above regarding the method for verifying functionality of a system-on-chip (SoC).

BRIEF DESCRIPTION OF THE DRAWINGS

The following will be apparent from elements of the figures, which are provided for illustrative purposes and are not necessarily to scale.

FIG. 11 is a block diagram of functional components of a computer system 1100 in accordance with an embodiment.

DETAILED DESCRIPTION

Figure 1:
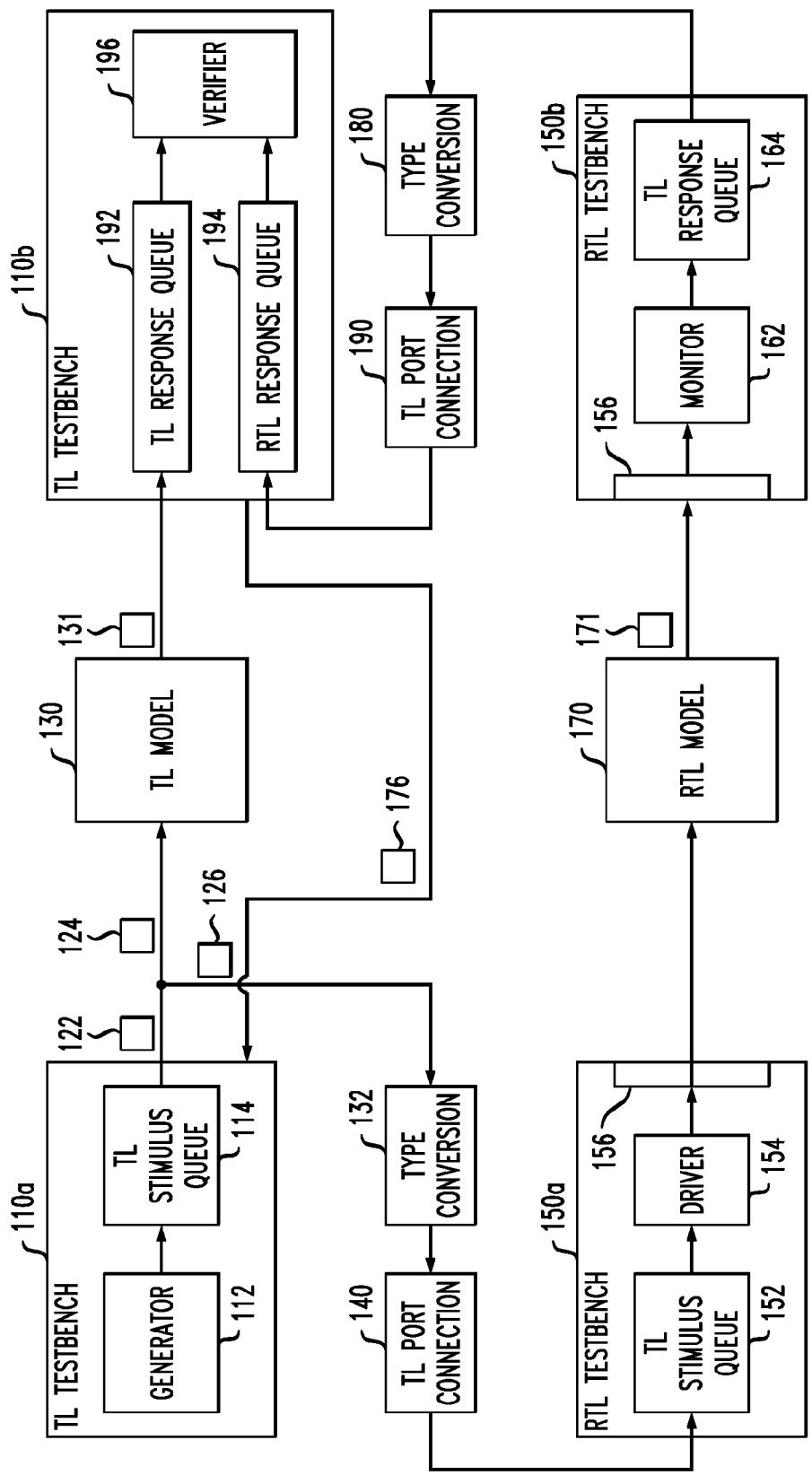
FIG. 1 is a block diagram of a computer-implemented verification system in accordance with an embodiment.
Figure 5:
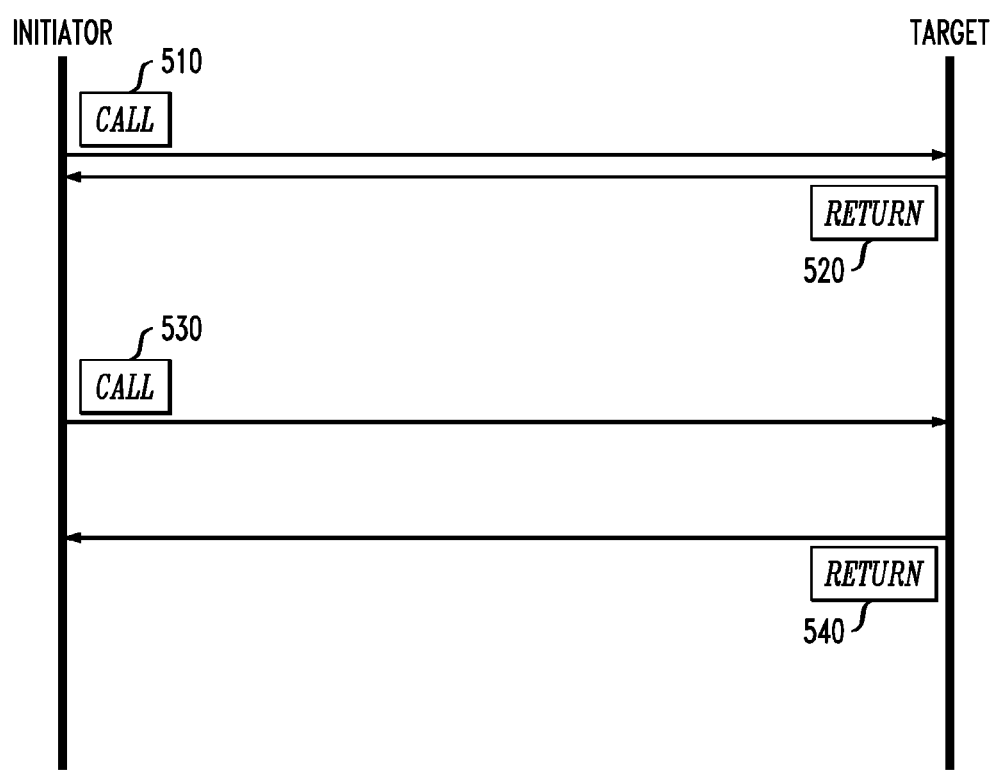
FIG. 5 is a signal diagram showing the Open SystemC Initiative (OSCI) standard TLM-2 loosely timed (LT) protocol.
Figure 7:
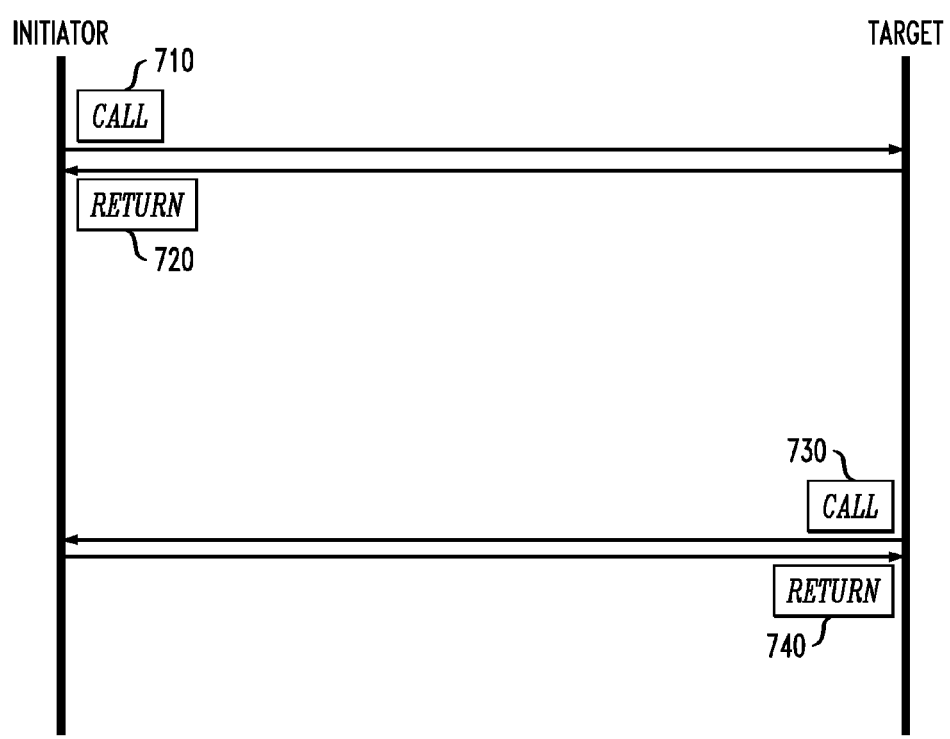
FIG. 7 is a signal diagram showing the Open SystemC Initiative (OSCI) standard TLM-2 approximately timed (AT) protocol.

FIG. 1 is a block diagram of a computer-implemented verification system 100 in accordance with an embodiment. Verification system 100 includes a transaction level (TL) testbench 110, a TL model 130, a register transfer level (RTL) testbench 150, and an RTL model 170, as well as other components for interfacing and synchronization between the TL and RTL as described below. Although TL and RTL are shown in FIG. 1, other levels having a higher level/lower level relationship may be employed as well. TL is a higher level than RTL because of coarser granularity in the functional and timing aspects of the TL testbench 110 and TL model 130 compared to the cycle accurate nature of the RTL testbench 150 and RTL model 170. Coarser functional granularity means that the TL does not involve signal level functional granularity, unlike RTL. Coarser timing granularity means that the TL model 110 and TL model 130 either have no timing granularity (are untimed) or have approximated timing granularity; in contrast, RTL is cycle accurate timed, meaning timing is specified to the clock cycle level and relative sequencing of cycles is specified and enforced. The Open SystemC Initiative (OSCI) standard TLM2.0, which specifies many aspects of TL modeling (TLM), further classifies "approximated timing" granularity as either loosely timed (LT) or approximately timed (AT). LT and AT, which are described further below in the context of FIGS. 5 and 7, are two standardized ways to provide transactions to a model such as the TL model 130.

Referring to FIG. 1, a generator 110 (sometimes called a sequencer) generates a stimulus transaction, which is stored in a TL stimulus queue 114. As used herein, queues are first in, first out (FIFO) data storage structures, which may be degenerate (a single storage element) in some cases as described below in the context of FIG. 6. The TL testbench 110 retrieves a stimulus transaction 122 from the TL stimulus queue 114 and sends the stimulus transaction (illustrated as 124) to the TL model. It is understood that transactions 122, 124, and 126 are all the same. In parallel, the TL testbench 110 also sends the same stimulus transaction (illustrated as 126) to the RTL testbench 150, which stores the transaction in a TL stimulus queue 152. The stimulus transaction 126 may undergo a type conversion 132 and is transmitted via a TL port connection 140 supported by the TL testbench 110 and by the RTL testbench 150. The optional type conversion logic 132 may be embedded in either the TL testbench 110, which has knowledge of the language used by the RTL testbench 150), or in the RTL testbench 150, which has knowledge of the language used by the TL testbench 110; for illustrative purposes, FIG. 1 shows a neutral configuration. Type conversion logic 132, when employed, converts the data types in the stimulus transaction 126 to make them compatible between different languages.

In zero or nonzero time, the TL model 130 transforms the stimulus transaction 124 into a response transaction 131 that is stored in a TL response queue 192. The TL model then returns from the transaction to signal to a verifier 196 (also referred to as a verification module) of the TL testbench 110 that a TL response transaction is available for processing. The TL testbench 110 (like the RTL testbench 150) is shown in FIG. 1 in two parts, one (110a) to the left of the TL model 130 and one (110b) to the right, corresponding to stimulus generation and response checking components, respectively. For convenience, these components of the testbench 110 are assigned the same reference character prefix 110, but it should be understood that these may be separate modules. Therefore, when a TL testbench generally is discussed, reference character 110 may be used, and when a stimulus generation or response checking module specifically is intended, characters 110a or 110b may be used; similar comments apply regarding nomenclature of RTL testbench 150 and its stimulus generation and response checking components 150a, 150b. Thus, TL testbench 110a may alternatively be referred to as stimulus generation logic 110a or TL testbench stimulus generation logic 110a, and TL testbench 110b may alternatively be referred to as response checking logic 110b, response checker 110b, or TL testbench response checking logic (or response checker) 110b.

The verifier 196, which is illustrated as a component within response checker 110b, compares response transactions produced at the TL and RTL levels to verify functionality of a system-on-chip (SoC) being designed, i.e., to verify electronic system functionality. The RTL response queue 194 that provides data to the verifier 196 is populated as follows.

The RTL testbench 150a retrieves the TL stimulus transaction (which may or may not have been type converted) from its internal TL stimulus queue 152. A driver 154, sometimes referred to as a consumer, drives the TL stimulus transaction onto a bus of the RTL model 170 via an interface 156 (also referred to as interface logic) that converts the transaction to a cycle accurate bus protocol of the RTL model 170. After a finite, nonzero time, the RTL model 170 transforms the input TL stimulus transaction into a cycle accurate RTL response transaction 171. Such activity by the RTL testbench 150a and RTL model 170 occurs in parallel with activity described above regarding the TL testbench 110 and TL model 130. At interface 156, the RTL testbench 150 converts the cycle accurate RTL response transaction into a TLM response transaction. A monitor 162, sometimes referred to as a consumer or monitor logic, is specific to a bus (e.g., USB, PCI) and monitors cycle level activity to detect the end of a transaction. The response transaction, now converted into a TL timing protocol, is stored in a response queue 164. The RTL testbench 150b sends the response transaction to the TL testbench 110b via a TL port connection 190 and an optional type conversion 180. The response transaction from the RTL testbench 150b is stored in an RTL response queue 194 at the TL testbench 110b. The verifier compares a head entry of the TL response queue 192 with a head entry of the RTL response queue 194 and sets a flag to a first state (e.g., PASS) on a correct comparison and to a second state (e.g., FAIL) on an unsuccessful comparison. In an embodiment, the TL response queue 192 and the RTL response queue 194 store entire functional transactions and do not store timing information.

After the comparison, a synchronization signal 176, e.g., SYNC, is asserted for synchronization purposes. The SYNC signal may be asserted by the verifier 196 or by a separate synchronization module. The SYNC signal is monitored by the TL testbench 110a (e.g., by the TL stimulus queue 114), which sends the next transmission to both the TL model 130 and the RTL testbench 150a on SYNC assertion. The TL stimulus queue 114 requests the next transaction from the generator 112 before—the SYNC signal arrives and stores the transaction so that the TL stimulus queue 114 is ready to transmit the transaction as soon as the SYNC signal assertion is detected. The SYNC signal is then de-asserted by the verifier 196 (or by a separate synchronization module). SYNC may also be asserted at boot time (time 0) to allow an initial transaction to be sent by the TL testbench 110 after a system reset. The TL model 130 and the RTL model 170 both process a stimulus transaction in parallel. In other words, timing (phase) or functional synchronization between TL and RTL is not relied upon while processing the stimulus transaction. Such parallel processing is advantageous for processing pipelined stimulus transactions, as described further below in the context of FIGS. 9-10, because both levels (TL and RTL) can pipeline and run stimulus transactions independently. In some embodiments, synchronization occurs only at the end of the transaction when response checking takes place.

As shown in FIG. 1, verification system 100 reuses stimulus transaction of the TL testbench 110a for the RTL testbench 150a and also reuses response transactions of the RTL testbench 150b for the TL testbench 110b. Such reuse of both the input and output of models at two levels has not previously been available in prior art systems. Prior art techniques that have considered transactions at different levels have not presented a unified, end-to-end, methodology that encompasses reuse of input (stimulus transactions) as well as output (transactions). Nor have prior art techniques presented viable synchronization between transmission of stimulus transactions between the two levels and processing of response transactions. Various embodiments may advantageously perform such synchronization without the need for an explicit synchronization signal received from the lower level (RTL), as is discussed in detail further below. The complete system framework provided by verification system 100 enables rapid re-tooling and SoC design verification at a higher level (e.g., TL) of electronic design with consistent, assured functionality at a lower level (e.g., RTL) as well. Verification of functionality by verification system 100 differs from verification of SoC performance (or timing), which other systems in the art address.

Figure 2:
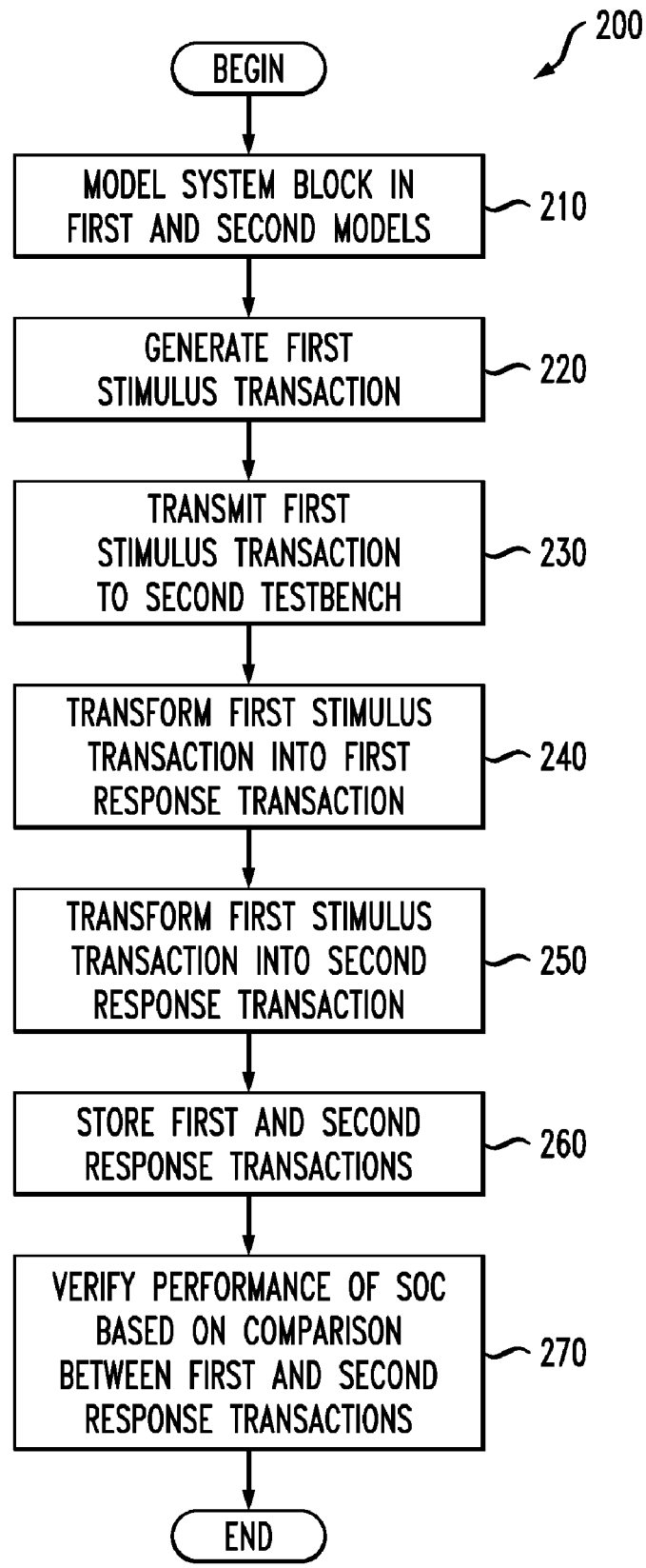
FIG. 2 is a flow diagram in accordance with an embodiment.

FIG. 2 is a flow diagram in accordance with an embodiment. After process 200 begins, a system block is modeled (210) in first and second models, where the second level is lower than the first level. A first stimulus transaction is generated (220) at a first testbench at the first level. The first stimulus transaction is transmitted (230) from the first testbench to a second testbench at the second level. The first stimulus transaction is transformed (240) into a first response transaction, using the first model, at the first level. The first stimulus transaction that is received at the second testbench is transformed (250) into a second response transaction, using the second model, at the second level. The first and second response transactions are stored (260) in first and second response queues, respectively. Functionality of a system-on-chip (SoC) at the first and second levels is verified (270) based on a comparison at the first testbench between head entries of the first and second response queues. Although process 200 is shown in FIG. 2 in an example sequence, that example is for convenience only and is not limiting. Transformation of the first stimulus transaction into the first response transaction (240) and transformation of the first stimulus transaction into the second response transaction (250) occur in parallel. Transmission of the first stimulus transaction (230) occurs in parallel with transmission of the first stimulus transaction to TL model 130 for transformation (240) into the first response transaction.

Transaction Level (TL) Port Connection Between TL Testbench and RTL Testbench

Different techniques can be employed to send a stimulus transaction from the TL testbench 110a to the cycle accurate RTL testbench 150a and to receive a response transaction from the RTL testbench 150b into the TL testbench 110b. The techniques employed depend mainly on the language used at the TL and at the RTL, the methodology used for the RTL testbench 150, and the TLM standard used in the TL testbench 110. TL port connection is shown in two components (denoted 140 and 190) in FIG. 1 for convenience; although one of ordinary skill in the art understands that there may be a single TL port connection module in practice. TL port connection 190 may alternatively be referred to as a TL transaction port.

Regarding hardware verification languages, SystemC is well suited for the TL testbench 110 because of its support for the TLM-1 and TLM-2 standards for communicating transactions and payloads between models or between a model and a testbench. As is known to one of ordinary skill in the art, SystemC is a class library built on the C++ programming language and hence fully supports the entire C++ language, which may be used for modeling at a higher level.

SystemVerilog also supports TL modeling, but because its core semantics are based on Verilog and because its inherent semantics are event driven, SystemVerilog is well suited for cycle accurate RTL model and testbench development. SystemVerilog also allows easy implementation of temporal domain concurrency, bit level manipulations and strong support for temporal domain assertions, functional coverage and constrained random stimuli, which are all used for functional verification and modeling at RTL. SystemVerilog also supports methodologies such as Open Verification Methodology (OVM) and Verification Methodology Manual (VMM) that are geared towards RTL verification.

SystemVerilog does not explicitly feature TLM-1 or TLM-2 style transactions or transaction communication protocols, unlike SystemC. Additionally, TLM-1 definition per the Open SystemC Initiative (OSCI) does not impose any particular transaction class structure or communication protocol structure (the terms OSCI and SystemC are often used interchangeably in the art). In that sense, SystemVerilog may be considered to be TLM-1 compliant, because SystemVerilog also does not impose any particular transaction class structure or communication protocol structure.

On the other hand, SystemC TLM-2 (i.e., SystemC as specified by the OSCI TLM-2 standard) does have a standard transaction definition called Generic Payload (GP) and also has standard communication protocols such as Loosely Timed (LT) and Approximately Timed (AT) protocols, which are discussed further below in the context of FIGS. 5 and 7. SystemVerilog does not have any such standard as of yet. Hence, SystemVerilog cannot be considered to be TLM-2 compliant.

Various embodiments utilize SystemC for the TL testbench and model and SystemVerilog for the RTL testbench and model. In other embodiments, other languages that support transactions and cycle accuracy are employed. Scenarios involving the same language at the higher and lower levels (e.g., SystemC for both TL and RTL testbenches or SystemVerilog for both TL and RTL Testbenches) do not pose transaction level incompatibilities or data type incompatibilities between the higher and lower levels and thus are not described in detail below; type conversion 132 is not necessary in such a scenario. Such same-language scenarios are applicable in various embodiments because both SystemC and SystemVerilog support transaction level modeling as well as cycle accurate modeling. If SystemVerilog is used for both TLM and RTL testbenches, OVM or VMM style methodologies may also be deployed at both the TLM and RTL levels, and transactions may be sent through the TLM testbench's OVM compliant driver. The transactions may be absorbed in the RTL testbench as a 'sequence_item' in its TL stimulus queue 152.

In embodiments employing SystemC for the TL testbench 110 and SystemVerilog for the RTL testbench 150, TLM-1 style transactions or TLM-2 style transactions may be sent from the TL testbench 110 to the RTL testbench 150. These scenarios are addressed below.

TL Port Connection Between SystemC TLM-1 TL Testbench and SystemVerilog RTL Testbench In one scenario, a SystemC testbench (stimulus logic) sends TLM-1 style transactions to a SystemVerilog testbench (stimulus logic), and the SystemVerilog testbench (response logic) sends TLM-1 style transactions back to the SystemC testbench (response logic).

When using the SystemC TLM-1 protocol for the TL testbench and SystemVerilog for the RTL testbench, there is no transaction level incompatibility between SystemC and SystemVerilog transactions, because neither SystemC TLM-1 nor SystemVerilog has a standard transaction class. Each application can create its own transaction class; from that point of view, the SystemC and SystemVerilog transaction classes may be designed to have the same class structure and properties to eliminate any incompatibilities.

For two different languages to communicate, a supporting simulator is capable of multi-language simulation, which is within the capability of most high end commercial logic simulators. Such simulators understand Transaction Level port connection and allow communication between the languages using transactions, as opposed to strictly signal level communication.

Specialized class libraries can also be created in SystemVerilog Open Verification Methodology (OVM) or Verification Methodology Manual (VMM) methodologies to facilitate passing of a transaction from SystemC to SystemVerilog and vice versa.

Both SystemVerilog and SystemC support a 4-valued logic system, including '0', '1', 'X', and 'Z' logic states. Therefore, unless either SystemVerilog or SystemC creates a particular user defined logic value system, there is no incompatibility between the two languages regarding logic values. Data type conversion between SystemC and SystemVerilog may still be employed as described below.

TL Port Connection Between SystemC TLM-2 TL Testbench and SystemVerilog RTL Testbench SystemVerilog does not support the TLM-2 style transaction class that SystemC supports. Therefore, passing a TLM-2 style transaction to SystemVerilog introduces certain complications. The following guidelines facilitate operation in this scenario.

The Direct Memory Interface (DMI) in the SystemC TLM-2 transaction class is not employed in this scenario. SystemVerilog does not support pointers, and DMI is designed to use pointers. If a pointer is passed in the SystemC transaction, SystemVerilog does not have a facility to retrieve data from the address pointed to by the pointer.

Additionally, the TLM-2 Generic Payload (GP) allows data to be passed by reference (i.e., using a pointer). However, data cannot be passed by reference from SystemC for the same reason mentioned above, namely, that SystemVerilog does not support pointers. Data may be passed by value (or constant reference) in order to be compatible with SystemVerilog.

Furthermore, in various embodiments, specialized class libraries are created in SystemVerilog OVM or VMM methodologies to facilitate passing of a transaction from SystemC to SystemVerilog. OVM and VMM are well understood methodologies in the art. The so-called 'specialized' class libraries are built by major electronic design automation (EDA) vendors and provided to facilitate transaction level port connection between two different languages.

For two different languages to communicate, the supporting simulator is capable of multi-language simulation, which is within the capability of most high end commercial logic simulators. Such simulators understand Transaction Level port connection and allow communication between the languages using transactions, as opposed to strictly signal level communication.

Type Conversion Between SystemC and SystemVerilog Testbenches

In various embodiments, the language used to develop the TL testbench is different from the language used to develop the RTL testbench. For example, the TL testbench 130 may be written in SystemC and the cycle accurate RTL testbench 170 may be written in SystemVerilog. In such a case, embodiments provide data type conversion 132 from one language to another.

Table 1 shows a comparison of a short list of data types between SystemVerilog and SystemC. A complete list of data types can be obtained by referring to a particular language's Language Reference Manual (LRM).

TABLE 1

Comparison of data types between SystemVerilog and SystemC

| SystemVerilog Data Types | SystemC Data Types |
|---|---|
| bit | sc_bit |
| logic | sc_logic |
| reg | bool |
| wire | Not Available |
| bit vector | sc_bv <n> |
| logic vector | sc_lv <n> |
| reg vector | Not Available |
| wire vector | Not Available |
| class | class |
| Not Available | pointer variable |
| union | union |
| int (w = 32) | sc_unit |
| shortint (w = 16) | sc_int |
| longint | sc_signed |
| real | double |
| shortreal | float |
| char | char |
| byte | char (unsigned) vector of size 8 |
| enum | enum |
| struct | struct |
| Not Available | sc_fixed |
| Not Available | sc_ufixed |
| Not Available | sc_fix |

TABLE 1-continued

Comparison of data types between SystemVerilog and SystemC

| SystemVerilog Data Types | SystemC Data Types |
|---|---|
| Not Available | sc_ufix |
| Not Available | array of signals |

In Table 1, "Not Available" means that the specific data type is available only in one language and not in another. It is recommended that such data types be avoided when sending transactions from one language to another. Alternatively, 'equivalent' data types in the "Not available" language may be used, and an incoming data type may be converted into the 'equivalent' data type. Such conversion may result in an output comparison mismatch at the verifier 196 between a TL response and a RTL response.

Data types of one language may be converted to a different language in many ways in various embodiments. A simple method to convert data types from SystemC to SystemVerilog is described below.

To convert data types from SystemC to SystemVerilog, type conversion functions are created in the SystemVerilog testbench. The SystemVerilog testbench captures the data fields of transactions coming in from the SystemC TL testbench and passes those data fields to data type conversion functions. Once such conversion is completed, the converted data types are applied to the incoming transaction, and the transaction is sent along with converted data to the rest of the SystemVerilog testbench. Sample pseudo-code for such type conversion is provided below:

```
//SystemC TLM Transaction (pseudo-code)
class SystemCTrans {
    sc_bit sEnb;
    sc_bv<16> sAddress;
    sc_fixed<30,32> sData;
};
SystemCTrans sc_trans; //SystemC Transaction
//< sc_trans is sent to SystemVerilog >
////////////////////////////////////
//Type Conversion from SystemC to SystemVerilog (pseudo-code)
//Transaction coming into SystemVerilog port is sc_trans
class SystemVTrans;
    bit vEnb;
    bit[15:0] vAddress;
    logic[31:0] vData;
endclass
SystemVTrans sv_trans = new; //SystemVerilog Transaction
//Compatible types. No conversion needed.
sv_trans.vEnb = sc_trans.sEnb;
sv_trans.vAddress = sc_trans.sAddress;
// Conversion for SystemC sc_fixed type which is not supported in
SystemVerilog.
sv_trans.vData = scFixed2svLogic (sc_trans.sData);
//< Now sv_trans can be sent to rest of SystemVerilog Testbench >
```

Similarly, when a transaction is sent from SystemVerilog to SystemC, data type conversion functions are provided in SystemC to convert SystemVerilog data types to SystemC data types. Sample pseudo-code for such type conversion is provided below:

```
//SystemVerilog TLM Transaction (pseudo-code)
class SystemVTrans;
    bit vEnb;
    bit[15:0] vAddress;
    logic[31:0] vData;
endclass
SystemVTrans sv_trans = new; //SystemVerilog Transaction
//< sv_trans is sent to SystemC >
////////////////////////////////////
//Type Conversion (from SystemVerilog to SystemC) (pseudo-code)
//Transaction coming into SystemC port is sv_trans
class SystemCTrans {
    sc_bit sEnb;
    sc_bv<16> sAddress;
    sc_fixed<32> sData;
};
SystemCTrans sc_trans; //SystemC Transaction
//Compatible types. No conversion needed.
sc_trans.vEnb = sv_trans.sEnb;
sc_trans.vAddress = sv_trans.sAddress;
//Conversion of 'reg' type which is not supported in SystemC
sc_trans.vData = svLogic2scFixed (sv_trans.sData);
//< Now sc_trans can be sent to rest of SystemC Testbench >
```

Of specific interest regarding incompatible data types between SystemVerilog and SystemC is the absence of a 'pointer' type in SystemVerilog. If the transaction in SystemC testbench uses a pointer variable, the SystemC testbench may retrieve data from the address pointed to by the pointer variable and pass the data to the SystemVerilog testbench. This is the simplest way to continue using pointer variables in SystemC without affecting transaction level connection with SystemVerilog.

The SystemC TLM 2.0 standard defines a specific transaction type called the Generic Payload (GP). One of the fields of this GP transaction is the Direct Memory Interface (DMI). DMI is essentially a pointer that passes between the initiator and the target sockets of SystemC TLM models, so that the initiator and the target can manipulate data directly at the address pointed to by the pointer without explicitly passing data back and forth through the Generic Payload. However, because SystemVerilog does not support pointer types, the DMI is not used to directly manipulate data between SystemC and SystemVerilog. In various embodiments, either the DMI field simply is not used, or data is passed by value (or constant reference) in the transaction.

Several guidelines are presented below in the context of passing data between two different languages in accordance with various embodiments.

Data types that are compatible between the TL testbench language and the RTL testbench language may be employed. User defined data types should not be used across the interface; they may be used within a testbench but should be converted to compatible data types before sending transactions across the interface. If data types do not have the same precision, data may get truncated in one of the two languages, and response checking may fail. In some embodiments, response checking is maintained at a lower precision level. For example, if a language does not support int64 type, an incoming int64 bit type is truncated to int (32 bits). If the response checking mechanism is designed to check only at 32-bit precision, and a 64-bit type is converted to a 32-bit type, response checking is successful. For complex data types, data type conversion utilities are used in some embodiments to convert data types from one language to another. For example, SystemC 'fixed' data types are not supported in SystemVerilog. Therefore, sc_fixed is converted from SystemC to SystemVerilog to enable passage between two languages. In some embodiments, template functions are created to allow one or more functions to convert many different data types.

Converting Between TLM Transactions and Cycle Accurate Bus

Cycle accurate activity may be extracted from a TL transaction, e.g., a TL stimulus transaction, in various ways. Examples utilizing TLM-2 loosely timed (LT) and approximately timed (AT) protocols are described below in relation to the well-known Advanced eXtensible Interface (AXI) bus, but these examples are not intended to be comprehensive.

Figure 3:
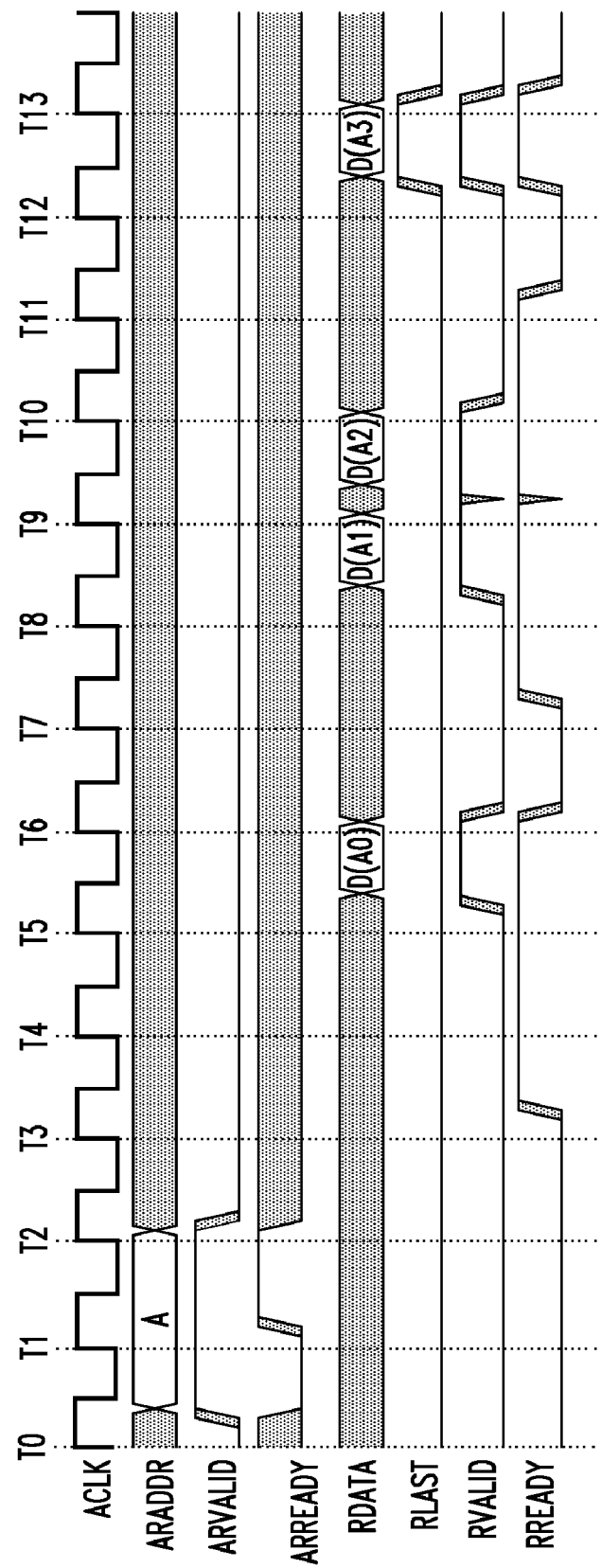
FIG. 3 is a signal diagram showing a burst read cycle in accordance with an embodiment.

FIG. 3 is a signal diagram showing an AXI burst read cycle. FIG. 3 shows conversion between a TLM-2 loosely timed (LT) transaction and a cycle accurate transaction. It should be understood by one of ordinary skill in the art that an individual transaction itself has no notion of LT or AT; rather, it is the manner in which a transaction is communicated using a protocol that defines LT or AT. As used herein, an LT (or AT) transaction refers to a transaction that is communicated in the context of an LT (or AT) protocol. At time T1, the RTL testbench driver 154 retrieves a transaction from internal TL stimulus queue 152 and signals to interface logic 156 to initiate an AXI read burst cycle. Time T1 corresponds to the beginning of a TL transaction. The RTL driver 154 passes to interface 156 the transaction's AXI bus protocol-specific payload (PSP), which is an extension of the LT generic payload (GP). A GP contains attributes, e.g., address, data, byte enables, etc., that are used to model a basic memory-mapped bus. If a bus cannot be modeled using the GP attributes, it is extended to accommodate attributes specific to a bus. Such an extended GP may be called a PSP. For example, for AXI interleaved writes and reads an identification (ID) tag (attribute) may be used. Such an ID attribute does not exist in the GP. Hence, the GP is extended to add an ID attribute and create a so-called AXI Protocol Specific Payload (PSP). For the sake of simplicity, an ID is not shown in the AXI bus protocol depicted in figures herein. The AXI protocol depicted here assumes strictly in-order transactions. Procedures relating to extension of a GP are detailed in the OSCI TLM-2 language reference manual widely known in the art. The RTL testbench's bus interface logic 156 starts the AXI cycle by driving an address on the ARADDR bus, as denoted by A in FIG. 3, asserting (high) an address valid signal ARVALID, and asserting (low) an address ready signal ARREADY. Between times T2 and T12, the RTL testbench's interface logic 156 reads burst data on the RDATA bus according to the AXI bus protocol and buffers the read data into one or more internal buffers. The RTL testbench's interface logic 156 detects the end of the AXI read burst cycle by detecting de-assertion (logic high) of RLAST, RVALID, and RREADY. Interface logic 156 signals the end of the cycle to monitor logic 162, which generates a response transaction using buffered read data and sends the response transaction to transaction level response queue 164, which in turn sends the transaction to the TL port connection 190, possibly via type conversion 180. Time T13 corresponds to the end of the TL transaction.

Figure 4:
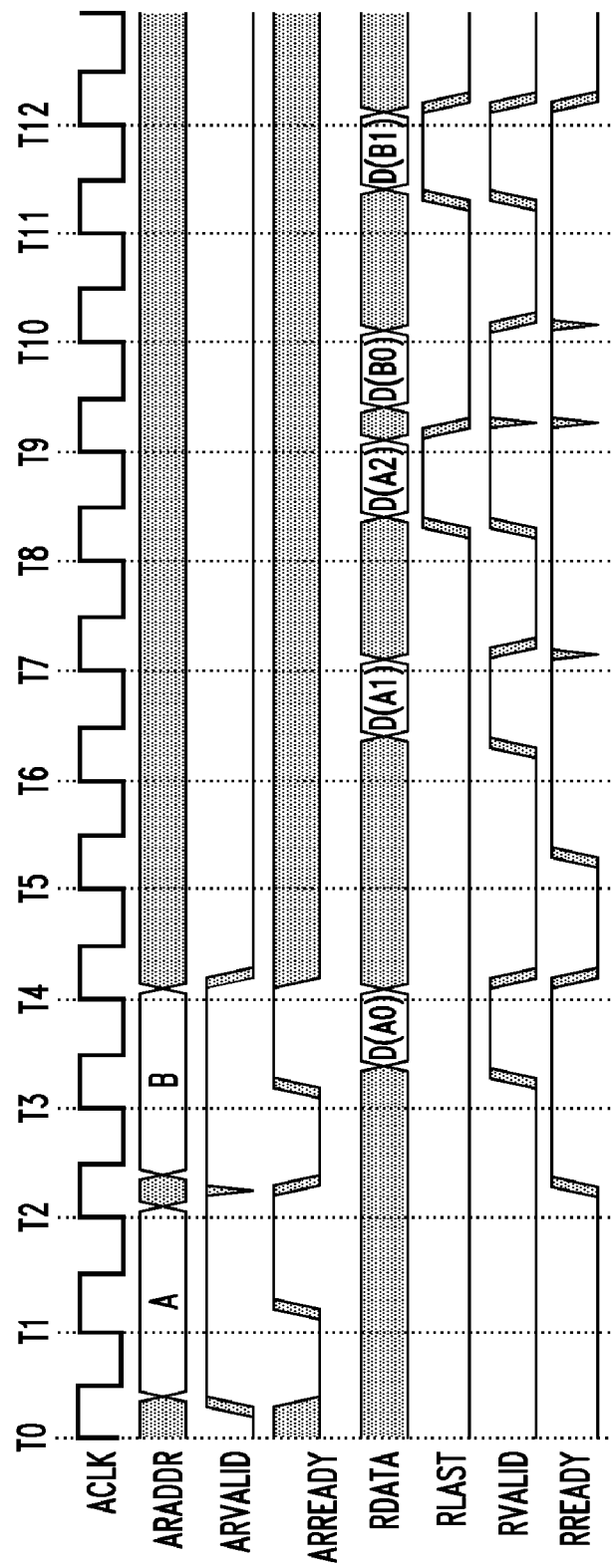
FIG. 4 is a signal diagram showing pipelined burst read cycles in accordance with an embodiment.

FIG. 4 is a signal diagram showing two pipelined burst read cycles. FIG. 4 shows conversion between TLM-2 approximately timed (AT) transactions and cycle accurate transactions. The end of each cycle occurs in-order, i.e., the end of cycle for the first read occurs before the end of cycle for the second read. At time T1, the RTL testbench driver 154 retrieves a transaction from internal TL stimulus queue 152 and signals to interface logic 156 to initiate an AXI read burst cycle. Time T1 corresponds to the beginning of the request phase for the first transaction. Driver 154 passes to interface 156 the transaction's AXI bus protocol-specific payload (PSP), which is an extension of the generic payload (GP). Interface logic 156 starts the AXI cycle by driving an address on the ARADDR bus, as denoted by A in FIG. 4, asserting (high) the address valid signal ARVALID, and asserting (low) the address ready signal ARREADY. At time T3, The driver 154 detects a second pending transaction in TL stimulus queue 152. Time T3 corresponds to the beginning of the request phase for the second transaction. Interface logic 156 starts the second AXI cycle by driving another address on the ARADDR bus, as denoted by B in FIG. 4, asserting (high) the address valid signal ARVALID and asserting (low) the address ready signal ARREADY. Time T4 corresponds to the beginning of the response phase for the first transaction. Between times T4 and T9, interface logic 156 reads burst data on the RDATA bus according to the AXI bus protocol and buffers the read data into one or more internal buffers. Time T9 corresponds to the end of the response phase for the first transaction. Interface logic 156 detects the end of the first AXI read burst cycle by detecting logic high on RLAST, RVALID, and RREADY. As shown in FIG. 4, it is known that this end-of-read is the end of the first read because the AXI protocol used in this example is strictly in-order. In other words, the first cycle finishes first, the second cycle finishes second, etc. Interface logic 156 signals the end of cycle to monitor logic 162, which generates a response transaction from the buffered data and sends the response transaction to TL response queue 164, which sends the transaction to TL port connection 190, possibly via type conversion 180. Time T10 corresponds to the beginning of the response phase for the second transaction. Between times T10 and T12, interface logic 156 reads burst data on the RDATA bus for the second read and buffers the read data into internal buffers. Time T12 corresponds to the end of the response phase for the second transaction. Interface logic detects the end of the second AXI read burst cycle by detecting logic high on RLAST, RVALID, and RREADY. Interface logic 156 signals the end of cycle to monitor logic 162, which generates a response transaction using buffered read data and sends the response transaction to transaction level response queue 164, which in turn sends the transaction to the TL port connection 190, possibly via type conversion 180.

Synchronizing Stimulus Application and Response Checking Between TLM and RTL Testbenches Stimulus application (application of generated stimuli) and response checking are synchronized between testbenches at different levels in various embodiments. The TL level is mostly timed using approximated timing, e.g., LT and/or AT, and the RTL level is cycle accurate timed. In various embodiments, a functional verification system, e.g., verification system 100, may operate in either AT or LT mode. These two communication modes do not change from transaction to transaction. The verification system may know (e.g., via a global flag or a bootstrap signal) that either LT or AT mode is employed, that the transactions at TL level ill communicate in either of the two modes, and that the transactions from TL to RTL will pass in either of the two modes. Various embodiments avoid the need to generate a synchronizing signal from RTL. Prior art systems require such an RTL synchronization signal. RTL logic is the logic that eventually is synthesized to silicon, and the addition of artificial synchronizing signals and/or logic to RTL is error prone and may be advantageously avoided in various embodiments.

The response checker 110b, e.g., the verifier 196 therein, determines when to signal (or synchronize) the TL testbench 110a, e.g., the TL stimulus queue 114 therein, for transmission of the next transaction to the RTL testbench 150. The RTL testbench 150b sends a RTL response transaction to the TL testbench 110b, which in turn compares the RTL response with the (already arrived) TL response. Once the response comparison is completed, the TL testbench 110b asserts a synchronization (SYNC) signal that causes the stimulus generation logic of the TL testbench 110a to send the next transaction to the RTL testbench 150a, thereby avoiding any need to receive a synchronizing signal from the RTL testbench 150b.

To explain this synchronization technique in detail, several scenarios involving different timing protocols are described below.

Synchronization Between TLM-2 LT TLM Testbench and Cycle Accurate RTL Testbench for Non-Pipelined LT Transactions Non-pipelined means a stimulus transaction is sent to the TL model 130 and to the RTL model 170 only after the response for the previous transaction is received.

FIG. 5 is a signal diagram showing the Open SystemC Initiative (OSCI) standard TLM-2 loosely timed (LT) protocol. This is a blocking protocol, which means that the initiator sends a transaction to the target (BEGIN_TRANSACTION), and the target returns from the function that implements or uses the transaction (END_TRANSACTION). Thus, LT is a two-phase protocol (BEGIN TRANSACTION, END_TRANSACTION). The target may or may not explicitly wait, i.e., consume time. In either case, the same initiator thread cannot issue another transaction to the target until the previous transaction has completed (i.e., blocking behavior). In the example at the top of FIG. 5, an initiator sends a transaction 510 to the target, i.e., "calls" the target, which then returns immediately with a return transaction 520. In the example at the bottom of FIG. 5, the initiator sends a call transaction 530 to the target, which waits a nonzero duration before sending a return transaction 540, during which time the same initiator thread is blocked from sending another transaction to the target. Call transactions 510, 530 and return transactions 520, 540 may be implemented with b transport( ) function invocations per the OSCI TLM-2 standard language reference manual. It is understood that each of the initiator and target in FIG. 5 may be a testbench or a model as in FIG. 1.

Figure 6:
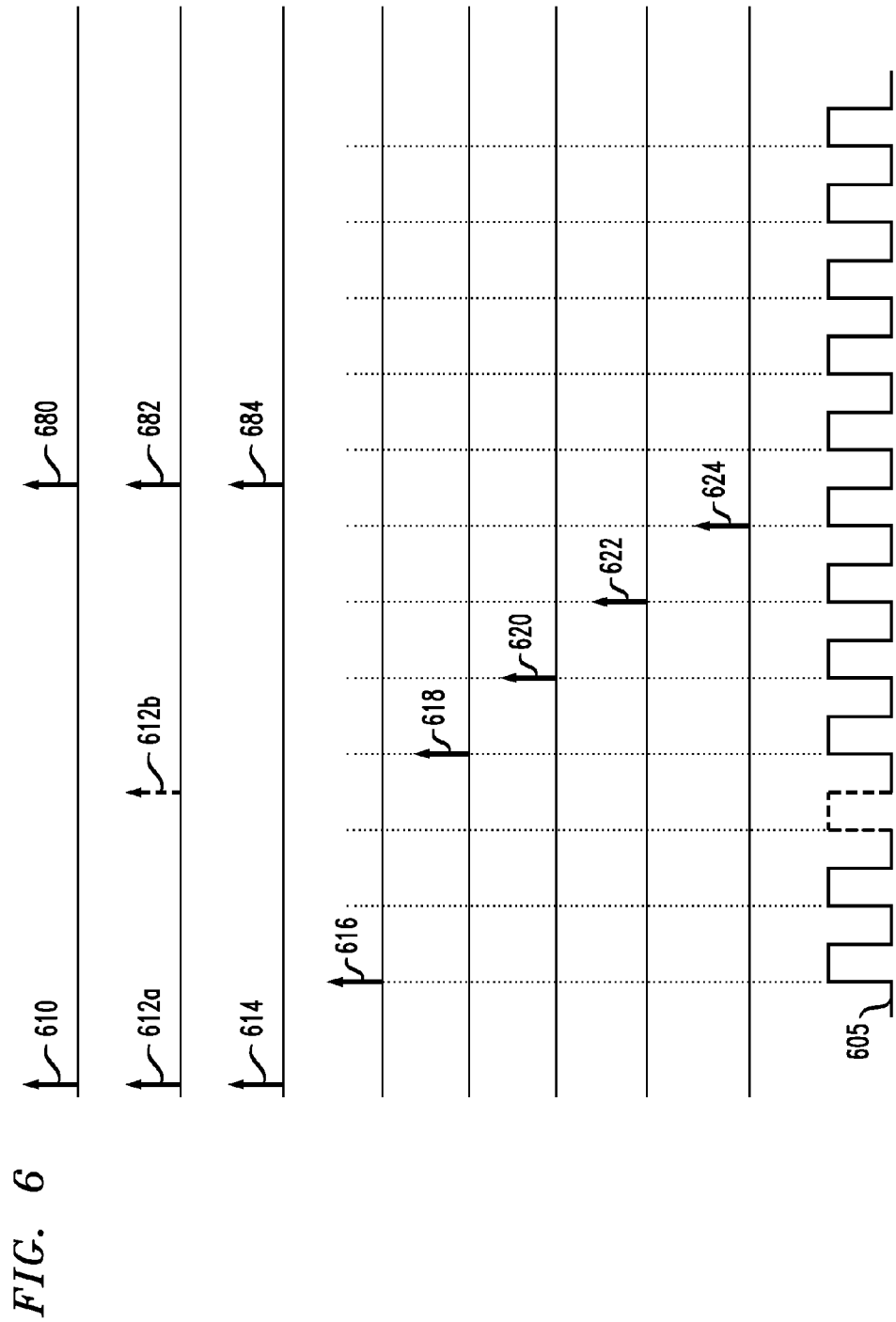
FIG. 6 is an event diagram showing the timing of various events associated with the scenario of FIG. 5.

FIG. 6 is an event diagram showing the timing of various events associated with the scenario of FIG. 5. Timing in FIG. 6 is with respect to a clock signal 605. The TL testbench 110a sends a TL stimulus transaction 122 to the TL model 130 at event 610. The TL model 130 sends a response transaction to the TL response queue 192 at events 612a, 612b; the timing of this transaction is denoted 612a, 612b because the response transaction may be produced in zero or nonzero time as a result of simulation. The "time" consumed by the TL model 130 may be 0 or a finite, nonzero time approximated by the model developer. In either case, the time consumed by the TL model 130 is an approximation in lieu of a cycle accurate model and cannot be longer than the time consumed by the cycle accurate RTL model 170. Because the transaction stream in this scenario is a non-pipelined in-order transaction stream (i.e., sending only one transaction at a time), the queue may be a single entry register. The TL testbench 110a sends the same TL stimulus transaction 122 to the RTL testbench 150a at event 614. The RTL testbench 150a reads the TL stimulus queue 152 and converts the transaction to a cycle accurate protocol at event 616. The RTL model 170 produces a cycle accurate output in response to the TL stimulus transaction 126 after a finite time that depends on the type of bus protocol used. The RTL monitor 162 converts the cycle accurate transaction to TL at event 618. The TL response is sent to a TL testbench transaction port at event 620. The TL testbench 110b compares the responses from TL and RTL at event 622, specifically by comparing head entries of the TL and RTL response queues 192, 194, and flags a PASS on correct comparison and a FAIL on incorrect comparison (i.e., different responses from RTL and TL, indicative of an error). After the comparison, the TL testbench response logic 110b signals the stimulus logic 110a, by asserting a SYNC signal, to send the next transaction to the TL model 130 and to the RTL testbench 150a at event 624. The response logic 110b then de-asserts the SYNC signal. Then, the next transaction starts at events 680, 682, and 684.

Synchronization Between TLM-2 at TLM Testbench and Cycle Accurate RTL Testbench for Non-Pipelined At Transactions FIG. 7 is a signal diagram showing the Open SystemC Initiative (OSCI) standard TLM-2 approximately timed (AT) protocol. The AT protocol, unlike the LT protocol, is non-blocking, meaning that the same initiator thread is not blocked from sending a new transaction to a target until a response is received. In the top example shown in FIG. 7, an initiator sends a call transaction 710, which may be implemented with a nb_transport_fw( ) function invocation per the OSCI TLM-2 standard language reference manual, to a target at simulation time 0. The call may specify a delay of 0 ns. The times provided in this example are illustrative only. The target may respond with a return transaction 720 specifying a delay of 10 ns, which is received at the initiator at time 10 ns. Later, when the target is ready with a response, e.g., at time 50 ns, the target sends a call transaction 730, which may be implemented with a nb_transport_bw( ) function invocation per the OSCI TLM-2 standard language reference manual, to the initiator specifying zero delay. The initiator sends a return transaction 740 to the target specifying a delay of, e.g., 100 ns; this transaction is received at simulation time 150 ns. Thus, an AT transaction is divided into four phases, commonly denoted BEGIN_REQ (begin request), END_REQ (end request), BEGIN_RESP (begin response), and END_RESP (end response).

Figure 8:
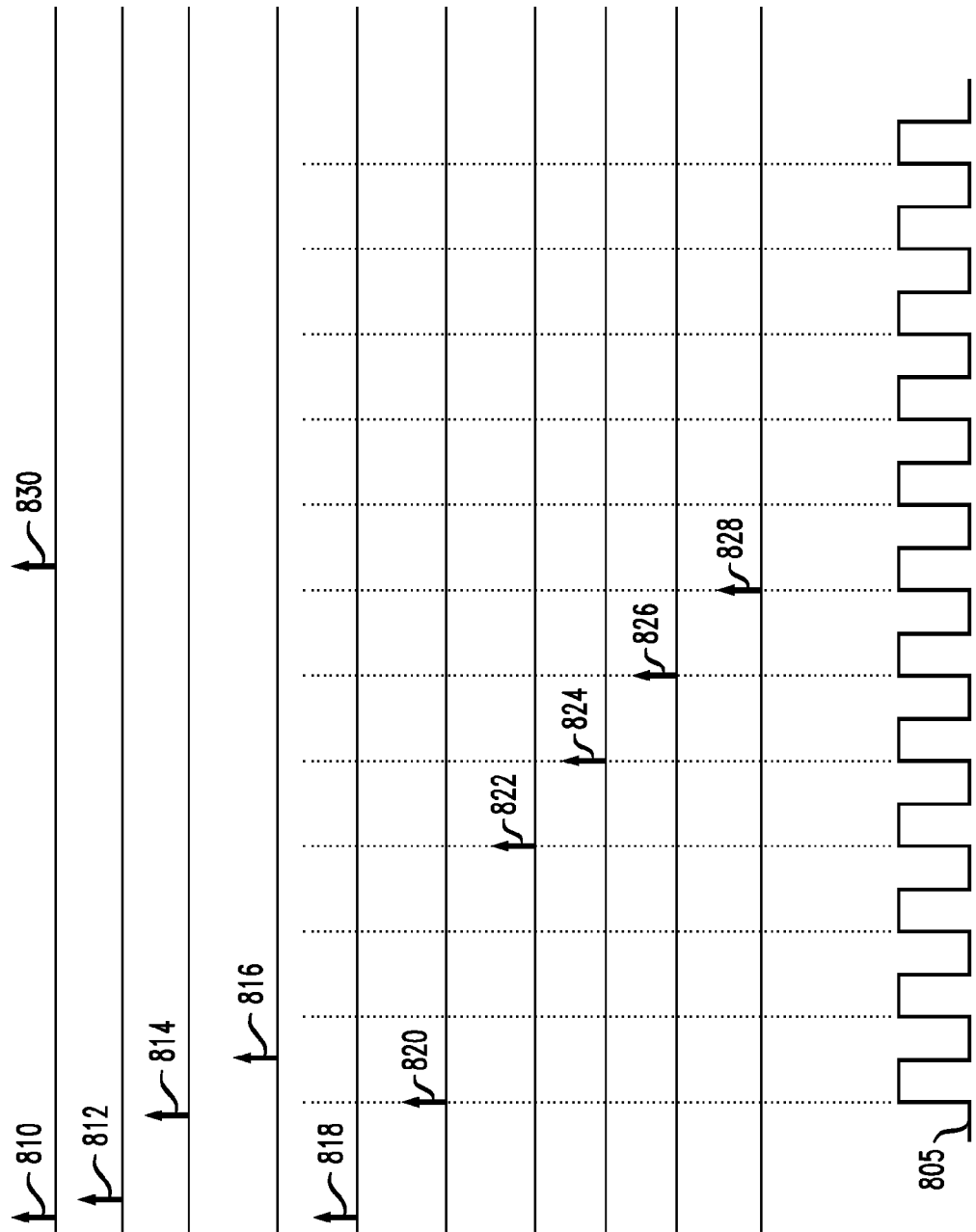
FIG. 8 is an event diagram showing the timing of various events associated with the scenario of FIG. 7.

FIG. 8 is an event diagram showing the timing of various events associated with the scenario of FIG. 7. Timing in FIG. 8 is with respect to a clock signal 805. The TL testbench 110a sends a TL stimulus transaction 122 to the TL model 130 at event 810 (begin request phase), e.g. using the AT protocol's nb_transport_fw( ) call. The TL model 130 completes the request phase with an end request phase at event 812. The TL model 130 sends a transaction indicating the beginning of the response phase to the TL testbench 110a at event 814. At event 816, the TL model 130 sends a response transaction indicating the end of the response phase to the TL testbench 110b, which adds the response transaction to the TL response queue 192. The TL testbench 110a sends the same stimulus transaction 122 to the RTL testbench 150a at event 818. Events 810 and 818 may happen at the same time. The RTL testbench 150a reads the TL stimulus queue 152 and converts the transaction to a cycle accurate protocol at event 820. The RTL model 170 produces a cycle accurate output in response to the TL stimulus transaction after a finite time that depends on the type of bus interface protocol used. The RTL testbench 150a and RTL model 170 simulate in parallel to the four phased AT transaction in progress at the TL testbench 110a and TL model 130. Synchronization is not needed between each of the four phases of the AT protocol and the RTL protocol. Monitor 162 of the RTL testbench response checking logic 150b converts the cycle accurate transaction into a TL response transaction at event 822. The response transaction is sent to a TL testbench transaction port 190 at event 824. The TL testbench 110b compares the responses from TL and RTL at event 826. Upon the comparison, the TL testbench response logic 110b signals the stimulus logic 110a, by asserting a SYNC signal, to send the next transaction to the TL model 130 and to the RTL testbench 150*a* at event 828. The response logic 110*b* then de-asserts the SYNC signal.

Figure 9:
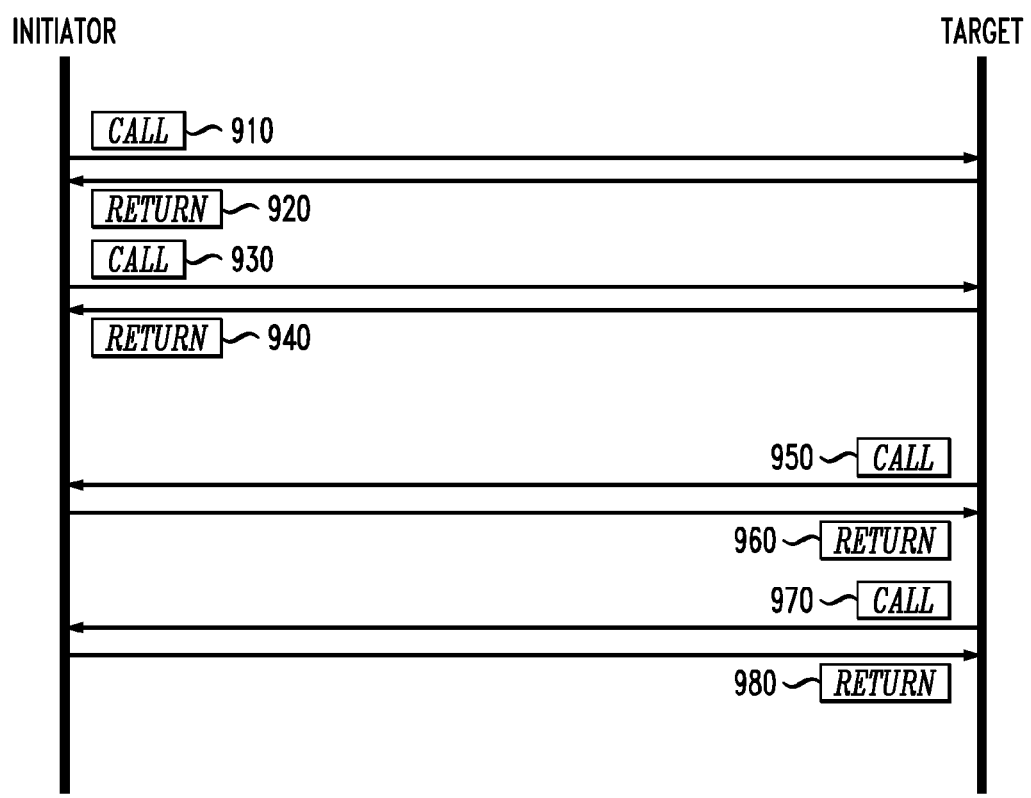
FIG. 9 is a signal diagram showing the Open SystemC Initiative (OSCI) standard TLM-2 approximately timed (AT) protocol with two pipelined in-order transactions.

Synchronization Between TLM-2 at TLM Testbench and Cycle Accurate RTL Testbench for Pipelined in-Order AT Transactions FIG. 9 is a signal diagram showing the Open SystemC Initiative (OSCI) standard TLM-2 approximately timed (AT) protocol with two pipelined in-order transactions. As described above, AT is a four-phased non-blocking protocol and uses non-blocking transport calls to communicate between an initiator and a target. A pipelined bus may be modeled with the AT protocol. In-order means that even though the same initiator thread sends consecutive (pipelined) requests without waiting for their responses, the initiator does expect the response to arrive in-order. In other words, if two requests Request1 and Request2 are issued by the initiator, Response1 (a response to Request1) must arrive before Response2. Most modern buses such as AXI are pipelined and benefit from reuse of stimulus and response transactions as in various embodiments. FIG. 9 shows two pipelined transactions. An initiator sends a call 910 (marking the BEGIN_REQ phase for the first transaction) to a target and waits for return transaction 920 (marking the END_REQ phase for the first transaction to arrive but does not wait for the BEGIN_RESP/END_RESP phases of the first transaction; rather, the same initiator thread sends (pipelines) the next BEGIN_REQ phase for a second transaction as call 930. Later, return transaction 940 arrives (marking the END_REQ for the second transaction). Later, the two response phases (BEGIN_RESP, END_RESP) ensue with call 950 and return 960 for the first transaction and with call 970 and return 980 for the second transaction.

Figure 10:
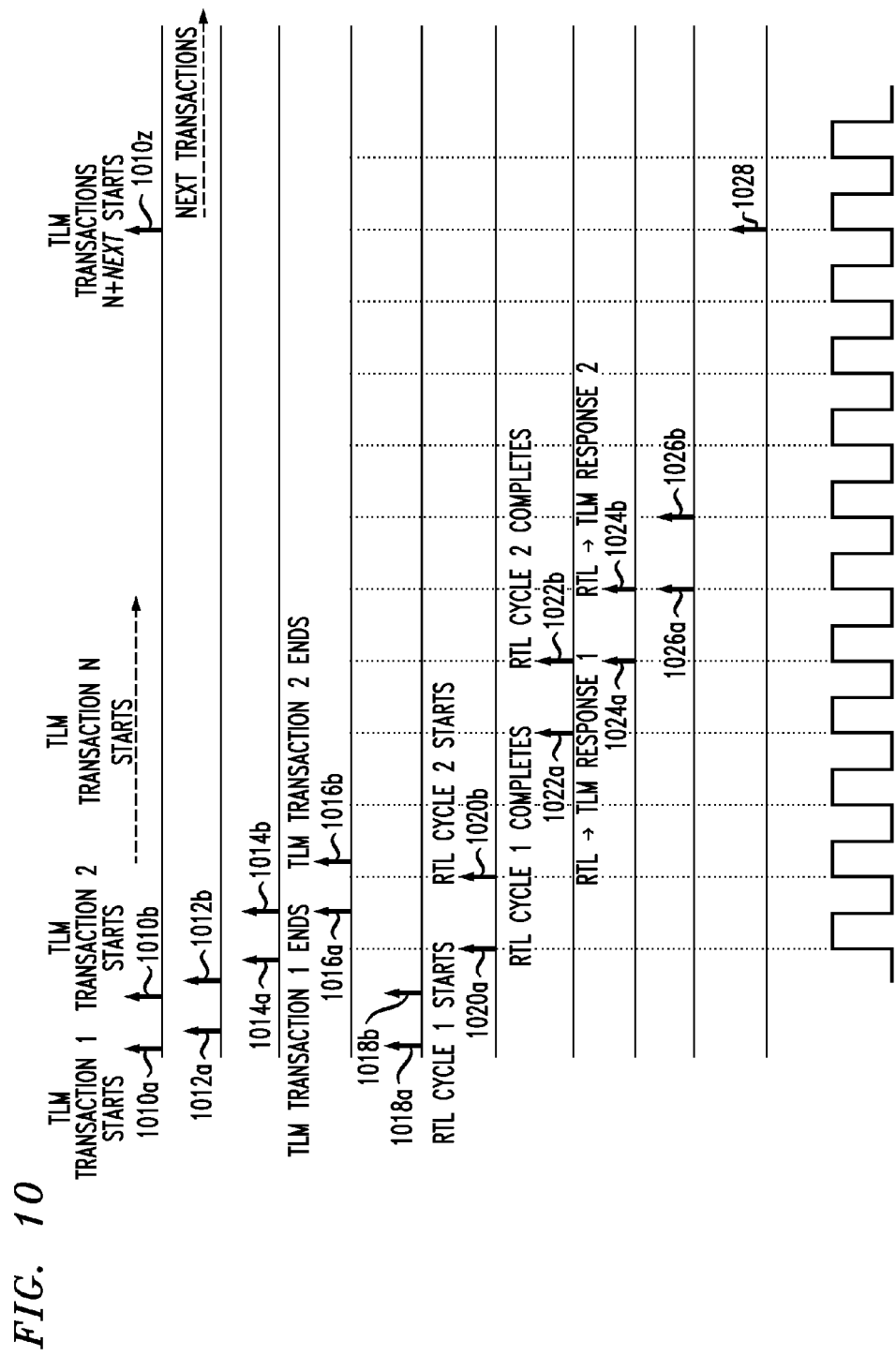
FIG. 10 is an event diagram showing the timing of various events associated with the scenario of FIG. 9.

FIG. 10 is an event diagram showing the timing of various events associated with the scenario of FIG. 9. The following description of events describes activities associated with a pair of pipelined transactions. Although two pipelined transactions are shown in the example below, more than two transactions may be pipelined as well, as suggested by FIG. 10, showing N transactions with dashed lines. Events are described below in a manner that facilitates understanding and promotes brevity; FIG. 10 provides specific timing details. For example, events 1010*a* and 1010*b* are described together, followed by events 1012*a* and 1012*b*, although FIG. 10 shows the actual order of events is 1010*a*, 1012*a*, 1010*b*, 1012*b*. Throughout FIG. 10, pairs of events are denoted with reference characters having 'a' and 'b' suffixes, where 'a' and 'b' denote events associated with the first and second transactions, respectively.

The TL testbench 110*a* sends a first stimulus transaction and a second stimulus transaction (BEGIN_REQ phase of each, i.e., each is a request transaction) to the TL model 130, e.g., using the AT communication protocol's nb_transport_fw( ) call, at events 1010*a* and 1010*b*, respectively. The second stimulus transaction is sent by the TL testbench 110*a* before the reception of a response from the first transaction; thus, these are considered pipelined transactions. In parallel, the TL testbench 110*a* also sends the same transactions to the RTL testbench 150*a* at events 1018*a*, 1018*b*. The TL model 130 accepts the first and second requests (first and second stimulus transactions) and sends an end_request transaction back to the TL testbench 110*a* for each request at events 1012*a*, 1012*b*. The TL model 130 sends a BEGIN_RESP transaction in response to each of the first and second stimulus transactions at events 1014*a*, 1014*b*, thereby signaling the TL testbench 110*b* that response data is ready for acceptance (retrieval) by the TL testbench 110*b*. The TL testbench response checking logic 110*b* accepts response data for each of the first and second transactions and completes the transactions with END_RESP status, storing the transactions in the TL response queue 192, at events 1016*a*, and 1016*b*.

The RTL model 170 converts the first and second stimulus transactions into a cycle accurate bus protocol supported by the RTL model 170 and drives the transactions on an RTL model bus at events 1020*a*, 1020*b*. Pipelined cycles may be issued to the RTL model 170 in this manner because the interface bus of the RTL model 170 supports a pipelined protocol, e.g., an AXI bus. The RTL model 170 produces cycle accurate outputs in response to each of the first and second stimulus transactions after a finite time, and the RTL testbench's response checking logic 150*b* converts the cycle accurate responses into TL response transactions, at events 1022*a*, 1022*b*. The RTL testbench 150*b* sends the first and second response transactions (these may be considered TL response transactions at this point) to the TL testbench transaction port connection 190 (possibly via a type conversion 180, if different languages are employed at TL and RTL), and the TL testbench response checking logic 110*b* stores the response transactions in RTL response queue 194, at events 1024*a*, 1024*b*, respectively. The verifier 196 compares the first (head) entry in the TL response queue 192 with the first (head) entry in the RTL response queue and flags a PASS on correct comparison and a FAIL on incorrect comparison at event 1026*a*. The verifier 196 compares the second (head) entry in the TL response queue 192 with the second (head) entry in the RTL response queue and flags a PASS on correct comparison and a FAIL on incorrect comparison at event 1026*b*. After each comparison the verifier 196 reads the immediately preceding entry in the TL response queue 192, i.e., the entry preceding the current header entry being processed. If this entry is empty, the TL testbench response checking logic 110*b* asserts a synchronization signal SYNC; if the entry is not empty, SYNC is not asserted. The SYNC signal is monitored by the generator 112, which starts sending the next set of pipelined transactions through TL stimulus queue 114 to both the TL model 130 and the RTL testbench 150*a* on detection of the SYNC assertion. The response checking logic 110*b*, e.g. the verifier 196 therein, then de-asserts the SYNC signal (not shown in FIG. 10).

In some embodiments, the generator 112 and TL stimulus queue (114) are enabled to continually send pipelined transactions without the need for explicit SYNC signaling after each transaction, thereby allowing a fully pipelined execution of the system.

In some embodiments, the TL stimulus queue 114 stops sending transactions to the TL stimulus queue 152 when the TL testbench 110*b* detects that its TL response queue 192 is full. When such a full queue is detected, the TL stimulus queue 114 stops sending further transactions to both the TL model 130 and the TL stimulus queue 152.

When the RTL model 170 finishes processing all pending pipelined transactions from its TL stimulus queue 152, it sends the last response transaction to the RTL response queue 194. The verifier 194 compares this transaction and reads the immediately preceding header entry, i.e., the entry preceding the current header entry being processed, in the TL response queue 192 as it does after each comparison. On detection of the immediately preceding header entry in this queue being empty, the verifier 194 asserts the SYNC signal at event 1028. The generator 112 and TL stimulus queue 114 may start sending the next set of transactions at event 1010*z* because the TL response queue 192 is empty. Thus, in some embodiments the TL stimulus queue 152 continues to send transactions (in a set of transactions) without a SYNC signal from the TL testbench 110b after each comparison in AT mode. Rather, a SYNC signal is asserted after the entire set of transactions is processed. Upon assertion of the SYNC signal, transmission of a new set of AT transactions from the TL testbench 110a to the RTL testbench 150a is initiated. The new set of transactions is processed like the previous set described above. By processing multiple transactions without synchronizing after each individual transaction, some embodiments provide fast, efficient, "full-throttle" operation that the AT protocol is designed for.

The SYNC signal may also be asserted at initial boot to enable an initial transaction to be sent by the TL testbench 110a at system startup.

FIG. 11 is a block diagram of functional components of a computer system 1100 in accordance with an embodiment of the invention. As used herein, the term computer system 1100 is broadly used to describe any computing device that can store and run one or more programs. Computer system 1100 may include a communication interface 1114 coupled to the bus 1106. The communication interface 1114 provides two-way communication between multiple computer systems 1100. The communication interface 1114 of a respective computer system 1100 transmits and receives electrical, electromagnetic or optical signals, including data streams representing various types of signal information, e.g., instructions, messages and data. A communication link 1115 links one computer system 1100 with another computer system 1100. For example, the communication link 1115 may be a LAN, in which case the communication interface 1114 may be a LAN card, or the communication link 1115 may be a public switched telephone network (PSTN), in which case the communication interface 1114 may be an integrated services digital network (ISDN) card or a modem.

Computer system 1100 may transmit and receive messages, data, and instructions, including programs, i.e., application code, through its respective communication link 1115 and communication interface 1114. Received program code (instructions) may be executed by the respective processor(s) 1107 as it is received, and/or stored in the storage device 1110, or other associated non-volatile media, for later execution.

In an embodiment, computer system 1100 operates in conjunction with a data storage system 1131, e.g., a data storage system 1131 that contains a database 1132 that is readily accessible by the computer system 1100. The computer system 1100 communicates with the data storage system 1131 through a data interface 1133. A data interface 1133, which is coupled to the bus 1106, transmits and receives electrical, electromagnetic or optical signals that include data streams representing various types of signal information, e.g., instructions, messages and data. In embodiments of the invention, the functions of the data interface 1133 may be performed by the communication interface 1114.

Computer system 1100 includes a bus 1106 or other communication mechanism for communicating instructions, messages and data, collectively, information, and one or more processors 1107 coupled with the bus 1106 for processing information. Computer system 1100 also includes a main memory 1108, such as a random access memory (RAM) or other dynamic storage device, coupled to the bus 1106 for storing dynamic data and instructions to be executed by the processor(s) 1107. The main memory 1108 also may be used for storing temporary data, i.e., variables, or other intermediate information during execution of instructions by the processor(s) 1107.

The computer system 1100 may further include a read only memory (ROM) 1109 or other static storage device coupled to the bus 1106 for storing static data and instructions for the processor(s) 1107. A storage device 1110, such as a magnetic disk or optical disk, may also be provided and coupled to the bus 1106 for storing data and instructions for the processor(s) 1107.

Computer system 1100 may be coupled via the bus 1106 to a display device 1111, such as, but not limited to, a display monitor (understood to be different from monitor 162 in FIG. 1), for displaying information to a user. An input device 1112, e.g., alphanumeric and/or other keys, is coupled to the bus 1106 for communicating information and command selections to the processor(s) 1107.

In an embodiment, an individual computer system 1100 performs specific operations by respective processor(s) 1107 executing one or more sequences of one or more instructions contained in the main memory 1108. Such instructions may be read into the main memory 1108 from another computer-readable tangible storage medium, such as the ROM 1109 or the storage device 1110. Execution of the sequences of instructions contained in the main memory 1108 causes the processor(s) 1107 to perform the processes described herein. For example, such instructions when executed may cause the processor(s) 1107 to perform process 200 in FIG. 2. In alternative embodiments, hard-wired circuitry may be used in place of or in combination with software instructions to implement an embodiment or a component of an embodiment. Thus, embodiments of the invention are not limited to any specific combination of hardware circuitry and/or software.

The term "computer readable storage medium," as used herein, refers to any tangible storage medium that provides information or is usable by the processor(s) 1107. Such a medium may take many forms, including, but not limited to, non-volatile, and volatile media. Non-volatile media, i.e., media that can retain information in the absence of power, includes the ROM 1109, CD ROM, CD-RW, DVD-ROM, DVD-RAM, DVD-RW, BD-ROM and flash memory, magnetic tape, and magnetic discs, for example. Volatile media, i.e., media that cannot retain information in the absence of power, includes the main memory 1108, cache memory or other register storage.

Although examples are illustrated and described herein, embodiments are nevertheless not limited to the details shown, since various modifications and structural changes may be made therein by those of ordinary skill within the scope and range of equivalents of the claims.

What is claimed is:

1. A method for verifying functionality of an integrated circuit system-on-chip (SoC), the method comprising:
modeling a system block in a first model at a first level and in a second model at a second level lower than the first level;
generating a first stimulus transaction at a first testbench at the first level;
transmitting the first stimulus transaction from the first testbench to a second testbench at the second level;
transforming the first stimulus transaction into a first response transaction, using the first model, at the first level;
transforming the first stimulus transaction received at the second testbench into a second response transaction, using the second model, at the second level;
storing the first and second response transactions in first and second response queues, respectively and verifying functionality of the SoC at the first and second levels based on a comparison at the first testbench between head entries of the first and second response queues.

2. The method of claim 1 wherein the first level is a transaction level (TL), the first model is a TL model, the first testbench is a TL testbench, the second level is a register transfer level (RTL), the second model is an RTL model, and the second testbench is an RTL testbench.

3. The method of claim 2, further comprising synchronizing transmission and comparison between the TL and RTL testbenches without receiving a synchronization signal from the RTL testbench.

4. The method of claim 2, further comprising:
asserting a synchronization signal after comparing the first response transaction to the second response transaction; and
transmitting a second stimulus transaction from the TL testbench to the RTL testbench in response to assertion of the synchronization signal.

5. The method of claim 4, wherein generating the first stimulus transaction comprises generating the first stimulus transaction with a loosely timed protocol; and wherein the first stimulus transaction is one of a plurality of non-pipelined, loosely timed transactions.

6. The method of claim 4, wherein generating the first stimulus transaction comprises generating the first stimulus transaction with an approximately timed protocol; and wherein the first stimulus transaction is one of a plurality of non-pipelined, approximately timed transactions.

7. The method of claim 4, wherein generating the first stimulus transaction comprises generating the first stimulus transaction with an approximately timed protocol; and wherein the first stimulus transaction is one of a plurality of pipelined, in-order, approximately timed transactions.

8. The method of claim 2, wherein transforming the first stimulus transaction into the second response transaction comprises:
converting the first stimulus transaction to a cycle accurate stimulus transaction conformant with a cycle accurate bus protocol of the RTL model;
driving the cycle accurate stimulus transaction on a bus of the RTL model; and
producing the second response transaction using the RTL model, the second response transaction being cycle accurate.

9. The method of claim 8, further comprising:
converting the second response transaction to a third response transaction conformant with the transaction level; and
transmitting the third response transaction to the TL testbench.

10. The method of claim 2, wherein the TL model and the TL testbench are implemented in a first hardware verification language, and the RTL model and the RTL testbench are implemented in a second hardware verification language.

11. The method of claim 10, wherein transmitting the first stimulus transaction from the TL testbench to the RTL testbench comprises:
converting a first data type of the first stimulus transaction in the first hardware verification language to a second data type in the second hardware verification language to provide a type converted transaction; and
transmitting the type converted transaction to the RTL testbench.

12. The method of claim 10, wherein the first and second hardware verification languages are SystemC and SystemVerilog, respectively.

13. The method of claim 2, wherein generating the first stimulus transaction comprises generating the first stimulus transaction with an approximately timed (AT) protocol; and wherein the first stimulus transaction is one of a first plurality of N pipelined, in-order, AT transactions; and wherein the method further comprises:
asserting a synchronization signal after an Nth AT transaction is processed and not between individual transactions among the N AT transactions; and
initiating transmission of a second plurality of pipelined, in-order AT transactions from the TL testbench to the RTL testbench in response to assertion of the synchronization signal.

14. A computer-implemented integrated circuit verification system comprising:
a first model at a first level;
a first testbench configured to provide a first stimulus transaction to the first model, the first testbench comprising:
a stimulus generator configured to generate the first stimulus transaction;
a first response queue and a second response queue, and
a verification module configured to verify functionality of a system-on-chip (SoC) based on a comparison between head entries of the first and second response queues;
a second model at a second level lower than the first level; and
a second testbench configured to:
receive the first stimulus transaction from the first testbench, and
provide the first stimulus transaction to the second model;
wherein the first and second response queues are configured to store response transactions produced by the first and second models, respectively.

15. The computer-implemented integrated circuit verification system of claim 14, wherein the first level is a transaction level (TL), the first model is a TL model, the first testbench is a TL testbench, the second level is a register transfer level (RTL), the second model is an RTL model, and the second testbench is an RTL testbench.

16. The computer-implemented integrated circuit verification system of claim 15, wherein the verification module is further configured to synchronize transmission and comparison between the TL and RTL testbenches without receiving a synchronization signal from the RTL testbench.

17. The computer-implemented integrated circuit verification system of claim 15, wherein the verification module is further configured to:
detect a flag provided by the verification module, the flag indicating a comparison result; and
assert a synchronization signal in response to detection of the flag;
wherein the TL testbench is configured to transmit a second stimulus transaction to the RTL testbench in response to the synchronization signal.

18. A computer readable storage medium having instructions stored thereon, the instructions when executed by a processor causing the processor to perform the operations of:
modeling a system block in a first model at a first level and in a second model at a second level lower than the first level;
generating a first stimulus transaction at a first testbench at the first level;

transmitting the first stimulus transaction from the first testbench to a second testbench at the second level transforming the first stimulus transaction into a first response transaction, using the first model, at the first level;

transforming the first stimulus transaction received at the second testbench into a second response transaction, using the second model, at the second level;

storing the first and second response transactions in first and second response queues, respectively; and verifying functionality of a system-on-chip (SoC) at the first and second levels based on a comparison at the first testbench between head entries of the first and second response queues.

19. The computer-readable storage medium of claim 18, wherein the first level is a transaction level (TL), the first model is a TL model, the first testbench is a TL testbench, the second level is a register transfer level (RTL), the second model is an RTL model, and the second testbench is an RTL testbench.

20. The computer readable storage medium of claim 19, wherein the instructions when executed further cause the processor to perform the operation of synchronizing transmission and comparison between the TL and RTL testbenches without receiving a synchronization signal from the RTL testbench.

* * * * *